United States Patent [19]

Zumsteg

[11] 4,344,046

[45] Aug. 10, 1982

[54] SIGNAL GENERATOR INCLUDING HIGH AND LOW FREQUENCY OSCILLATORS

[75] Inventor: Alphonse E. Zumsteg, Solothurn, Switzerland

[73] Assignee: Societe Suisse pour L'Industrie Horlogere Management Services S.A., Bienne, Switzerland

[21] Appl. No.: 126,154

[22] Filed: Feb. 29, 1980

[30] Foreign Application Priority Data

Mar. 9, 1979 [CH] Switzerland ........................ 2267/79

[51] Int. Cl.[3] .......................... H03B 5/04; H03B 5/32

[52] U.S. Cl. ...................................... 331/158; 331/37; 331/46; 331/175; 331/176

[58] Field of Search ....................... 331/37, 46, 40, 41, 331/42, 47, 116 R, 116 FE, 162, 175, 176, 30, 32, 14, 158; 368/159

[56] References Cited

U.S. PATENT DOCUMENTS

| | | | |
|---|---|---|---|
| 3,364,439 | 1/1968 | Cohen et al. | 331/17 |
| 3,978,650 | 9/1976 | Hashimoto et al. | 331/176 X |
| 4,159,622 | 7/1979 | Akahane | 331/176 X |
| 4,241,435 | 12/1980 | Fujita et al. | 331/47 X |

FOREIGN PATENT DOCUMENTS

12570/72 4/1976 Switzerland .

OTHER PUBLICATIONS

Effenberger, Jahrbuch der Deutschen Gesellschaftfür Chronometrie E.V. vol. 28, 1977, pp. 9–15, Stuttgart, Germany.

*Primary Examiner*—Siegfried H. Grimm

*Attorney, Agent, or Firm*—Wender, Murase & White

[57] ABSTRACT

A signal generator includes a high frequency oscillator such as a quartz crystal oscillator at a frequency of 4.19 MHz, a low frequency quartz oscillator with a frequency of 32 kHz, a beat frequency generator for producing a correction signal which is transmitted to a programmable frequency divider, and an electronic switch for periodic switching of the high frequency quartz oscillator. By periodically switching-on the high frequency quartz oscillator, comparing its frequency curve with that of the low frequency quartz oscillator and appropriately adjusting the programmable frequency divider, the advantages of long term stability, temperature of behavior and aging of a high frequency oscillator are combined with the low current consumption characteristics associated with the low frequency quartz oscillator, whereby the life of a battery powering the signal generator can be substantially extended.

5 Claims, 4 Drawing Figures

SIGNAL GENERATOR INCLUDING HIGH AND LOW FREQUENCY OSCILLATORS

BACKGROUND OF THE INVENTION

The present invention relates to a signal generator having a high frequency resonator, such resonators being on the one hand, very accurate and, on the other hand, having relatively high long-term stability.

High frequency quartz resonators having a frequency of 4.19 MHz are known and are used for example, in wristwatches. Although temperature stability and long-term behavior is substantially more favorable than in conventional low frequency quartz resonators having a frequency of 32 kHz, the current consumption of such high frequency resonators is substantially higher, thus requiring frequent replacement of batteries in the watch. In view of the development of batteries having a long-term life expectancy of 5–10 years, it is desirable to construct an oscillator exhibiting all the advantages of high frequency oscillators, but having the low current consumption generally associated with low frequency oscillators.

SUMMARY OF THE INVENTION

According to the present invention, a signal generator having a high frequency quartz oscillator with reduced current consumption includes a circuit containing a low frequency quartz oscillator, means to produce a correction signal used for controlling a programmable frequency divider and an electronic switch for the periodic switching of the high frequency quartz oscillator.

In a preferred embodiment of the present invention, the means for producing the correction signal includes a beat frequency generator and, by using a low frequency oscillator with low current consumption and by periodically switching on the high frequency quartz oscillator, a high frequency quartz resonator may be used which has a frequency higher than those used hitherto, such as 8.38 MHz, which, with reference to temperature behaviour and volume, is more desirable than a quartz resonator at a frequency of 4.19 MHz, in the case of quartz crystals having a cut/section in accordance with U.S. Pat. No. 4,071,797.

BRIEF DESCRIPTION OF THE DRAWINGS

The invention will be described further, by way of example, with reference to the accompanying drawings, in which.

DESCRIPTION OF THE PREFERRED EMBODIMENT

Figure 1:
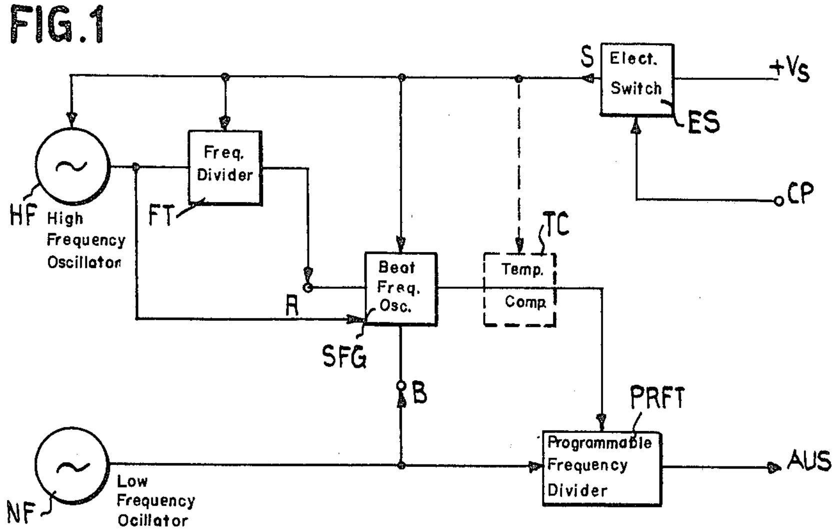
FIG. 1 is a block diagram of a signal generator according to the present invention.

FIG. 1 shows a block diagram of a signal generator according to the present invention. A high frequency quartz oscillator HF having a frequency of, for example, 4.19 MHz, 8.38 MHz or higher, is connected to a frequency divider FT so as to produce a signal of 32 kHz delivered to point A to which is connected a beat frequency generator SFG. In a preferred embodiment, oscillator HF is a crystal controlled oscillator having a quartz crystal cut in accordance with U.S. Pat. No. 4,071,797. A low frequency oscillator NF, for example, a conventional crystal controlled oscillator having a quartz resonator, produces a signal at a frequency of 32 kHz; this signal is passed, at point B, to the beat frequency generator SFG. As described in further detail hereinbelow, a correction signal is produced which is passed to a programmable frequency divider PRFT which is also supplied with the low frequency signal. If necessary, the low frequency signal is corrected in this programmable frequency divider and passed to output AUS from where it is connected to a known timer circuit, not described in detail herein.

An electronic switch ES, supplied with a supply voltage Vs, is controlled by a signal CP from the timer circuit so as to produce a periodic signal S, which periodically switches the frequency divider FT and the beat frequency generator SPG. In the case of a 4.19 MHz high frequency quartz for example, calculations have shown that a switch-on time of at least 16 seconds is necessary in order to obtain an adequately accurate correction signal and thereby attain a resolution of $1 \cdot 10^{-3}$ seconds per day. The switch-off time, for example, may amount to 15 minutes, i.e., the signal CP is produced every 15 minutes for 16 seconds. This reduces the current consumption of the high frequency oscillator to about one-fiftieth.

Every 15 minutes a new learning cycle begins and, if during this period the frequency of the oscillator NF has changed, the programmable frequency divider PRFT is reset.

If a higher degree of accuracy is desired, a temperature compensation circuit TC, as shown in broken lines in FIG. 1, is switched on to keep the influence of temperature negligibly small. Since two oscillating quartz resonators are already used, digital temperature compensation by means of two quartz resonators is suggested in this case.

Figure 2:
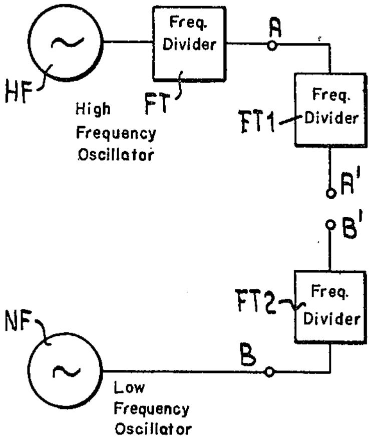
FIG. 2 is a detail from an embodiment of the circuit of FIG. 1.
Figure 3:
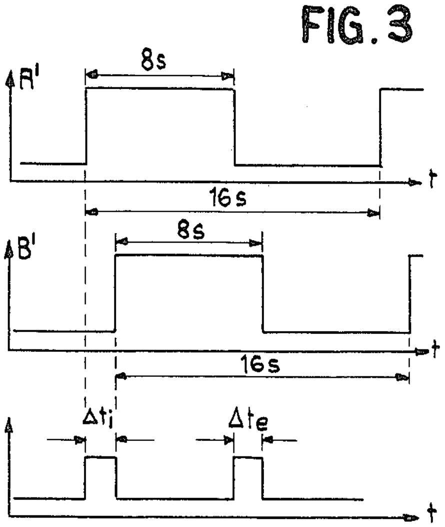
FIG. 3 is a timing diagram of a pulse of both quartz oscillators.
Figure 4:
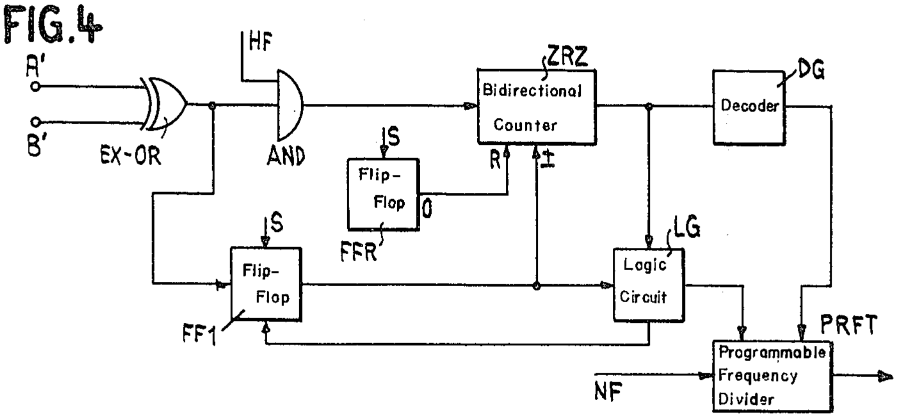
FIG. 4 is a block diagram of the beat frequency generator.

FIGS. 2 and 4 show further details of a circuit for producing correction signals. The high frequency of 4.19 or 8.38 MHz produced by oscillator HF is reduced by the first frequency divider FT to 32 kHz and by a second frequency divider FT1 to a frequency of 1/16 Hz. The low frequency of 32 kHz from oscillator NF is also reduced by a frequency divider FT2 to 1/16 Hz. With a high frequency oscillator HF having a frequency of 8.38 MHz it would also be possible to select a frequency of ⅛ Hz. The signals present at points A′ and B′ are then compared to produce the correction signals; however, direct comparison of both frequencies of 1/16 Hz, as is readily calculated, would be too inaccurate and it is therefore necessary to make a comparison in which a time interval of 0.2 μs, corresponding to 4.19 MHz is used as a unit. The diagram of FIG. 3 shows that the difference of the pulse at A′ and at B′ is taken, whereby the difference $\Delta t_i$ of the leading edges of both pulses and the difference $\Delta t_e$ of the trailing edges of both pulses are subtracted or added to generate a frequency correction signal.

In FIG. 4 a circuit capable of implementing the operation described above with reference to FIG. 3 is shown. The two signals A′ and B′ reach an Exclusive-Or (EX-OR) gate, which operates only when the input signals from points A′ and B′; produce a difference, i.e., if a $\Delta t_i$ or a $\Delta t_e$ exists. The signal from the EX-OR gate reaches an AND gate at which the 4.19 MHz signal from oscillator HF is switched. The output of the AND gate is delivered to a bidirectional counter ZRZ, the sign (±) of which is given by a flip-flop FF1. In the bidirectional counter ZRZ the difference of $\Delta t_i$ and $\Delta t_e$ is formed, whereby $\Delta t_e$ may also be greater than $\Delta t_1$. In order, in this case, to control the counter correctly, a signal is passed from the counter ZRZ during zero crossing to a logic circuit LG and a signal is supplied from the flip-flop FF1 concerning its state. In the case of a zero crossing of the counter ZRZ, the logic circuit LG generates a pulse to the flip-flop FF1 which thereupon changes the sign of the signal being delivered to the counter ZRZ, whereupon the counter ZRZ counts in the correct direction. A second flip-flop FFR effects reset of the bidirectional counter ZRZ at the beginning of measurement, whereby the two flip-flops FF1 FFR, in turn, are set to zero by the periodic signal S produced by the electronic switch ES during switching on of the high frequency oscillator HF.

The output from the counter ZRZ passes via a decoder DG to the programmable frequency divider PRFT, and a sign signal is supplied from the logic circuit LG. In this manner the programmable frequency divider PRFT constantly receives a correction signal which corresponds to the difference between the signals of the high frequency and the low frequency resonators, so that the output signal AUS behaves like a signal of the high frequency quartz oscillator with regard to accuracy, temperature effects and long-term characteristics, whilst the current consumption corresponds substantially to that of the permanently connected 32 kHz low frequency quartz oscillator. The temperature compensation circuit TC mentioned during the discussion of FIG. 1, above, could conveniently be connected between the bidirectional counter ZRZ and the decoder DG.

The arrangement may also be such that the frequency difference always has the same sign during temperature change and aging of the quartz crystal, so that the circuit may be substantially simplified.

It can be appreciated that the invention is not limited to the values of 32 kHz, 4.19 MHz or 8.38 MHz quoted herein, but that other quartz resonators having different values may also be used. The above-described signal generator may be used wherever high operating accuracy, favorable temperature and long term behavior features are required, and wherever the space available for implementation of an oscillator is small. This applies, for example, to a wristwatch and a film camera.

It is also possible for the period in which the frequency comparison occurs to differ from the value stated. This period is dependent upon the maximum available frequency and the required solution of the setting of the frequency. An alternative interval may also be chosen within which the high frequency oscillator is switched off.

What I claim is:

1. A signal generator having reduced current consumption, comprising:

a high frequency crystal oscillator;

a low frequency crystal oscillator;

means connected to said high and said low frequency oscillators for producing a frequency correction signal;

a programmable frequency divider connected to said low frequency oscillator and controlled by said frequency correction signal for dividing the frequency of said low frequency oscillator to produce an output signal of the signal generator; and an electronic switch connected to said high frequency oscillator to periodically switch said high frequency oscillator on and off, whereby current consumption in the signal generator is reduced.

2. A signal generator according to claim 1, in which said high frequency oscillator has an oscillation frequency of at least 4.19 MHz and said low frequency oscillator has an oscillation frequency of 32 kHz.

3. A signal generator according to claim 1, in which said means for producing a correction signal includes a beat frequency generator.

4. A signal generator according to claim 3, in which said beat frequency generator includes an EX-OR gate followed by an AND gate which is controlled by said high frequency oscillator, a bidirectional counter connected to the output of said AND gate, and a logic circuit for switching the counting direction of said bidirectional counter.

5. A signal generator according to claim 1, in which a temperature compensating circuit is connected between said means for producing a correction signal and said programmable frequency divider.

* * * * *